United States Patent [19]
Lundberg

[11] Patent Number: 5,811,983
[45] Date of Patent: Sep. 22, 1998

[54] TEST RING OSCILLATOR

[75] Inventor: James R. Lundberg, Austin, Tex.

[73] Assignee: Integrated Device Technology, Inc., Santa Clara, Calif.

[21] Appl. No.: 707,151

[22] Filed: Sep. 3, 1996

[51] Int. Cl.⁶ ................................................ G01R 31/02
[52] U.S. Cl. .......................................... 324/763; 324/765
[58] Field of Search ................................... 324/763, 764, 324/765; 368/100–125; 371/22.5–22.6

[56] References Cited

U.S. PATENT DOCUMENTS

| | | | |
|---|---|---|---|
| 3,931,588 | 1/1976 | Gehweiler | 331/57 |
| 4,587,480 | 5/1986 | Zasio | 324/73 |
| 4,771,251 | 9/1988 | Allen et al. | 331/57 |
| 4,782,283 | 11/1988 | Zasio | 324/158.1 |
| 4,891,609 | 1/1990 | Eilley | 331/57 |
| 5,083,299 | 1/1992 | Schwanke et al. | 368/113 |
| 5,095,267 | 3/1992 | Merrill et al. | 324/158.1 |
| 5,446,395 | 8/1995 | Goto | 324/763 |
| 5,485,126 | 1/1996 | Gersbach et al. | 331/57 |
| 5,594,360 | 1/1997 | Wojciechowski | 324/765 |

*Primary Examiner*—Ernest F. Karlsen
*Assistant Examiner*—Anh Phung
*Attorney, Agent, or Firm*—James Huffman

[57] ABSTRACT

An apparatus and method for measuring parasitic differences between dissimilar conductive paths on a semiconductor is provided. The apparatus provides a ring oscillator which has two propagation paths. The first path is traversed on a logical transition from low to high, and the second path is traversed on a logical transition from high to low. The gate stages for the first path may be interconnected via a metal conductive layer, and the gate stages for the second path may be connected to a dissimilar metal, or polycide, for example. A single output signal is produced which has a period equal to twice the delay of the inverter stages, plus any delay associated with the parasitic difference in the two paths. The duty cycle of the periodic signal may then be used to determine the parasitic difference between the two materials used to interconnect the stages in the ring oscillator.

39 Claims, 5 Drawing Sheets

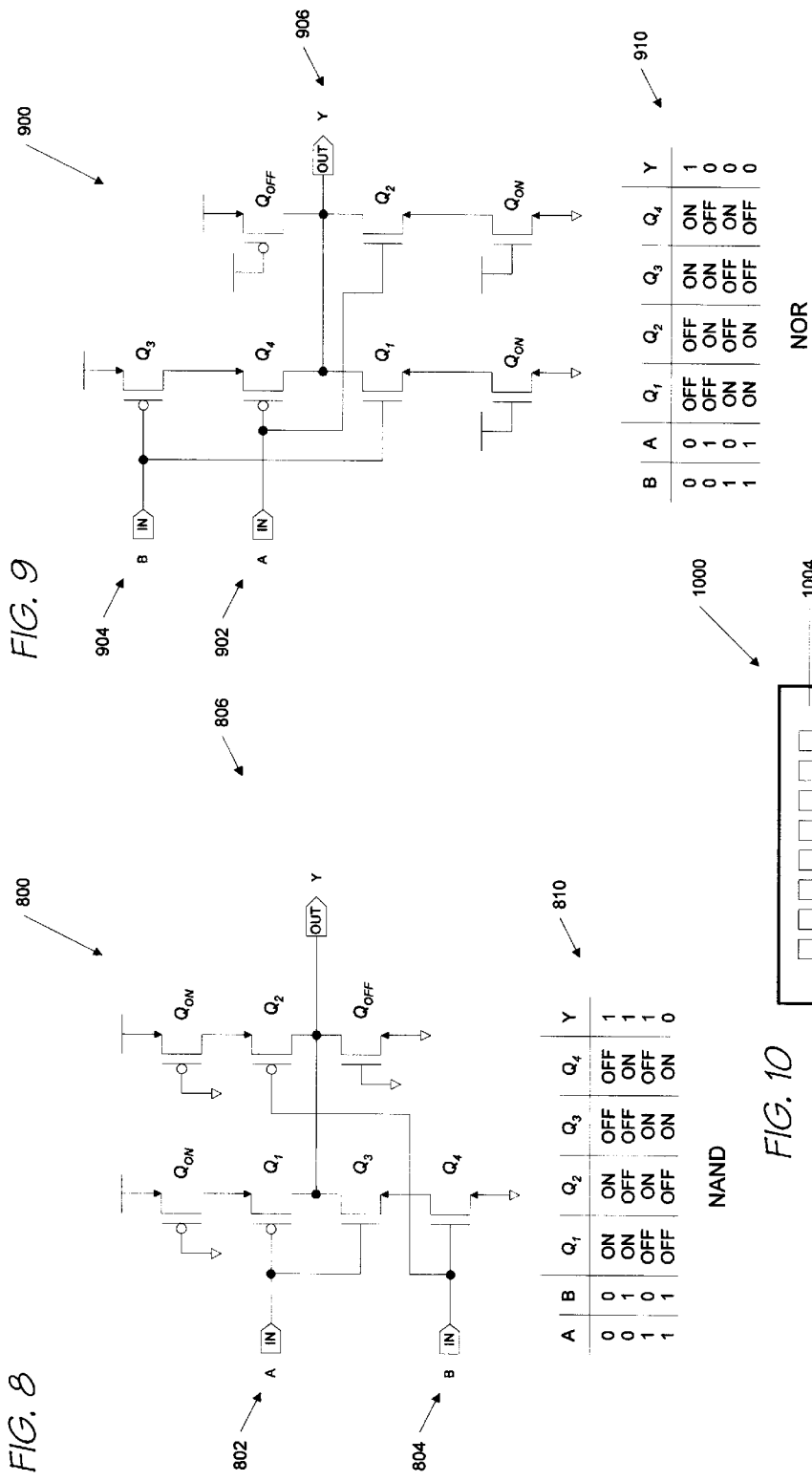
FIG. 9
FIG. 8
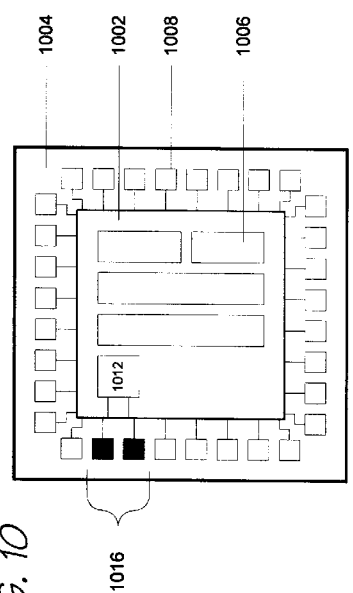
FIG. 10

TEST RING OSCILLATOR

BACKGROUND OF THE INVENTION

1. Field of the Invention

This invention relates in general to the field of parasitic measurements in semiconductors, and more particularly to a test ring oscillator for measurement of conductor parasitics.

2. Description of the Related Art

Test ring oscillators have been used in semiconductor devices to determine propagation characteristics of particular logic structures, as well as to measure the effect interconnection material has on signal propagation between gates in the logic structures. To better understand the prior art in measuring semiconductor parasitics, a general background of ring oscillators will be given, followed by an application of ring oscillator technology to measure the effect different interconnection material has on signal propagation in semiconductors.

Referring to FIG. 1, a prior art ring oscillator 100 is shown. The ring oscillator 100 includes a plurality of inverter stages 102, 104, 106, 108 and 110. The use of the inverter stages 102–110 is exemplary only. One skilled in the art will appreciate that more stages may be needed to achieve a particular result. The inverter stages 102–110 are connected to each other serially, with the output of the last inverter 110 connected to the input of the first inverter 102, to form a ring. Between each of the inverters 102–110 are connection nodes 112–120. These connection nodes 112–120 will be used to illustrate the propagation of a signal around the ring 100.

The output portion of each inverter stage takes a finite time to charge or discharge the input capacitance of the following inverter stage to the threshold value. The number of inverting stages in the ring oscillator 100 is odd, and the stages are cascaded in a loop so that at a certain frequency, a 180 degree phase shift is imparted to signals passing around the loop. One skilled in the art understands that in a differential ring oscillator, an even number of inverter stages may be used.

Now referring to FIGS. 1 and 2, a timing diagram 200 is shown which illustrates the waveforms present at each of the connection nodes 112–120. When the inverter stages 102–110 are first powered up (or when an enable signal is provided), assume that the input terminal of inverter stage 102 goes high, as shown in FIG. 2. The output terminal 114 of inverter 102 goes low in response to the voltage appearing at the input terminal thereof. A logic 0 at the output terminal 114 of inverter 102 is also a logic 0 at the input terminal of inverter 104. A logic 0 at the input terminal of inverter 104 causes a logic 1 to appear at the output terminal 116 of inverter 104. The logic inversion continues and after a given time period corresponding to the sum of the delay times associated with the inverters 102–110, the input terminal of inverter 102 (node 112) has a logic 0 applied to it. The process continues, with each stage performing its inverter function.

After another time period corresponding to the sum of the delay times associated with the inverter stages 102–110, the input terminal 112 of inverter 102 has a logic 1 applied to it. At this point in time, a full period of a signal waveform has been generated in the ring oscillator 100. That is, looking at node 112, the waveform has progressed from a logic 1, to a logic 0 and back to a logic 1 state. Therefore, the period of the signal is equal to twice the sum of the delay times from all the cascaded stages. Once around the ring 100 corresponds to half the period and twice around the ring corresponds to the full period.

With the above understanding of ring oscillators, an application will now be provided which illustrates the use of ring oscillators to test parasitics on a semiconductor device. Referring to FIG. 3, a semiconductor 300 is shown. The semiconductor 300 includes internal circuitry 306 mounted on a pad 304 to provide connection between the circuitry 306 and external devices. The circuitry is connected to I/O pads 308 via trace lines 310.

Also shown on the semiconductor 300 are two ring oscillators 312, 314 which are connected to external pads 316, 318. The ring oscillators 312, 314 are similar to the one shown in FIG. 1. However, interconnection of the inverter stages may be accomplished using any of the conductive paths (or layers) provided within the semiconductor 300. For example, the inverter stages of oscillator 312 may be connected to each other via a first conductive layer, say polysilicon, and the inverter stages of oscillator 314 may be connected to each other via a second conductive layer, say metal, or metal silicide. Each of these conductive layers will have electrical parasitics, i.e., capacitance and resistance, associated with them. By placing multiple oscillators on the semiconductor 300, and by using different conductive layers or materials to interconnect the inverter stages, relative measurement of the conductive layers parasitics may be performed. In conventional form, it is common to interconnect the stages of one ring oscillator directly, without going through metal, to provide a baseline measurement against which the other ring oscillators are compared.

Referring to FIG. 4, two ring oscillators 402 and 404 are shown which illustrate this measurement. Ring oscillator 402 shows inverter stages cascaded in a ring with no metal connection (or minimum length metal) between the stages. Ring oscillator 404 is shown with the inverter stages connected together via a metal layer, or other conductive material. Each connection between the inverter stages has an associated impedance 406 which is represented by a resistor 408 in series with the connection, and a capacitor 410 between the connection and ground. The effect of the interconnection impedance is to increase the charge and discharge time for each stage in the ring, and thereby increase the period of oscillation for the ring. Exemplary timing diagrams for the ring oscillators 402, 404 are shown as 412, 414, respectively. In this example, the period of oscillation for the ring oscillator 404 having metal interconnections is shown to be twice that of oscillator 402. This additional delay is a result of the parasitic difference between the no metal interconnection and the metal interconnection of the two ring oscillators.

Thus, if one skilled in the art wishes to measure the effect of various conductive layers on their circuitry, it is common for them to place multiple ring oscillators on the semiconductor, each interconnected by a different conductive layer or material. A comparison of the periods of oscillation for each of the ring oscillators provides a relative understanding of the parasitics associated with each conductive layer. This information may then be used by a designer to modify or validate his computer model of a device, to modify interconnection of his circuitry, or to fine tune the manufacturing process associated with each conductive layer.

A problem with the above methodology is that for each conductive layer to be tested, a pair of ring oscillators is necessary. The first oscillator provides a baseline for comparison, with the second oscillator compared to the first.

In addition, two test pads may be required for each ring oscillator. The first is used to stimulate or enable the oscillator, the second to measure the periodic output. It is possible for microcode within the chip to be tested to enable the oscillators. Probes are connected to the output pads for each ring oscillator, and the waveforms are measured. A comparison of the waveforms is then made to determine period difference, and thus the relative parasitic difference between the two conductive layers. Two measurements may require two instruments (or a dual input instrument) such as an oscilloscope, which must be read by the operator. Or, in the alternative, a single instrument can be used, but the two measurements must be made serially. Thus, two probes, two measurements, and comparison of the measurements may be required by the operator to understand the relative parasitic effect of a particular conductive layer.

What is needed is an apparatus and method which allows testing of parasitics of different interconnection structures, but which requires only a single measurement, from a single circuit. Such an apparatus and method would allow the operator to use a single probe, with a single measurement instrument, to determine parasitic differences between the different interconnection structures. Such an apparatus and method would provide a more cost effective means for determining interconnection parasitics, and would potentially reduce human error associated with multiple measurements.

SUMMARY

To address the above-detailed deficiencies, it is an object of the present invention to provide an apparatus and method for determining the parasitics of different interconnection structures within a semiconductor device. Moreover, it is an object of the present invention to provide an apparatus and method which provides indicia of interconnection structure parasitics within a single periodic signal.

Accordingly, in the attainment of the aforementioned objects, it is a feature of the present invention to provide a test apparatus for quantifying parasitics on a microprocessor, the test apparatus including: a plurality of first gate stages, the first gate stages having a first portion and a second portion; a plurality of second gate stages, the second gate stages having a first portion and a second portion, the second gate stages connected in between the plurality of first gate stages, wherein the plurality of first gate stages and the plurality of second gate stages are connected together to form a ring oscillator, the ring oscillator producing a periodic signal; a first signal path within the ring oscillator, the first signal path flowing through the first portion of the plurality of first gate stages and the first portion of the plurality of second gate stages; a second signal path within the ring oscillator, the second signal path flowing through the second portion of the plurality of first gate stages and the second portion of the plurality of second gate stages; a test node, connected between one of the plurality of first gate stages and one of the plurality of second gate stages, for monitoring the periodic signal produced by the ring oscillator; wherein the high portion of the periodic signal produced by the ring oscillator at the test node flows through the first signal path, and the low portion of the periodic signal produced by said ring oscillator at said test node flows through the second signal path; whereby the relationship of the high portion and the low portion of the periodic signal at the test node corresponds to the difference between the parasitics of the first signal path and the second signal path.

An additional feature of the present invention is to provide a semiconductor device, manufactured on a substrate, the semiconductor device having a plurality of transistors connected together with interconnection materials having dissimilar electrical parasitics, the semiconductor device having a plurality of test circuits, the test circuits providing indicia of the electrical parasitics of the interconnection materials, where each of the test circuits includes: a dual path ring oscillator, the ring oscillator including: a plurality of gate stages connected together to form a ring; a first path through the gate stages connected using a first interconnection material; and a second path through the gate stages connected using a second interconnection material; wherein the first path and the second path through the gate stages produces a periodic signal, the signal having a duty cycle corresponding to the electrical parasitic difference between the first interconnection material and the second interconnection material; and a test node, connected between two of the plurality of gate stages, for detecting the periodic signal.

It is a further feature of the present invention to provide a method for measuring parasitics on a semiconductor device, the semiconductor device having a dual path test circuit which produces a periodic signal, the method including: connecting a first interconnection material along a first path of the dual path test circuit; connecting a second interconnection material along a second path of the dual path test circuit; measuring the high portion of the periodic signal propagated through the first path; measuring the low portion of the periodic signal propagated through the second path; and comparing the measured high and low portions of the periodic signal to determine the parasitic difference between the first and second interconnection materials.

An advantage of the present invention is that a single test structure can be used to correlate parasitic differences in semiconductor layers.

Another advantage is that parasitic measurements may be made using a single signal for each measurement of interest, rather than a pair of signals.

A further advantage is that since only a single measurement is required for each item of interest, test measurements can be made in less time.

Additional features and advantages of the invention will be described hereinafter. Those skilled in the art should appreciate that they can readily use the disclosed conception and specific embodiment as a basis for designing or modifying other structures for carrying out the same purposes of the present invention.

BRIEF DESCRIPTION OF THE DRAWINGS

These and other objects, features, and advantages of the present invention will become better understood with regard to the following description, and accompanying drawings where:

FIG. 8 is a schematic illustrating the transistor structure of the NAND gates used in the test ring oscillator shown in FIG. 5.

FIG. 9 is a schematic illustrating the transistor structure of the NOR gates used in the test ring oscillator shown in FIG. 5.

FIG. 10 is a block diagram of a semiconductor chip which includes the test ring oscillator according to the present invention.

DETAILED DESCRIPTION

Figure 5:
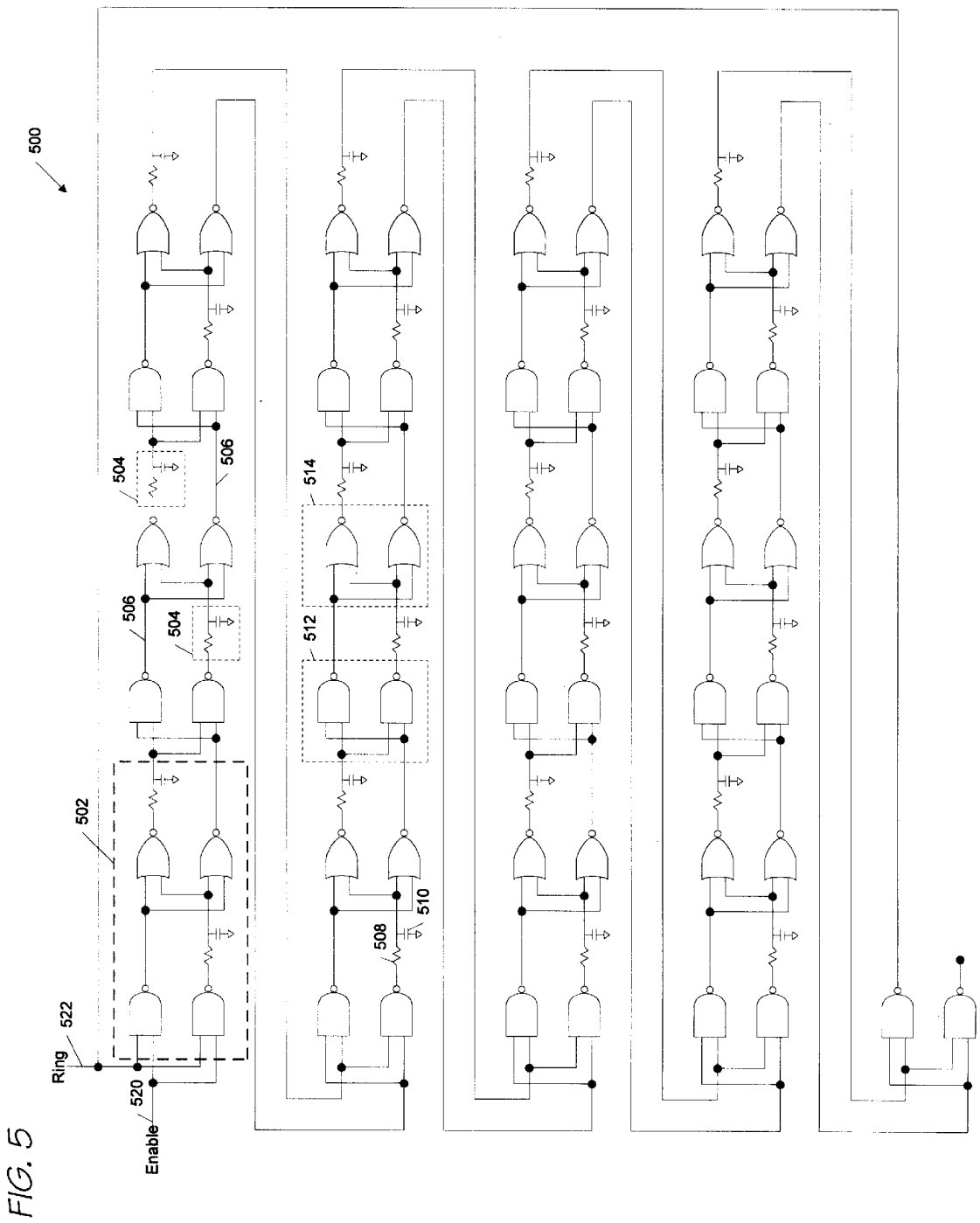
FIG. 5 is a schematic of the test ring oscillator according to the present invention.

Referring to FIG. 5, a dual path test ring oscillator 500 according to the present invention is provided. The ring oscillator 500 contains a plurality of alternating gate stages 502 which include a first gate pair 512 and a second gate pair 514. In one embodiment the first gate pair 512 includes two NAND gates, and the second gate pair 514 includes two NOR gates. One skilled in the art appreciates that a NAND/NOR gate combination can function similar to that of an inverter, but allows inverting logic to be controlled by two signals rather than one. For example, a NAND gate provides a logic 0 output when both of its inputs have a logic value of 1. And, a NOR gate provides a logic 1 output when both of its inputs have a logic value of 0. In the oscillator 500, a pair of NAND/NOR gates are used in each stage, as will be more fully described below.

The first gate pair 512 and second gate pair 514 are cascaded to provide twenty-five gate stages in the oscillator 500. The outputs of each gate in the gate pair 512 are provided as inputs to each gate in the gate pair 514. However, interconnection between the outputs of gate pair 512 and the inputs to gate pair 514 are made through different conductive layers on a semiconductor (not shown). For example, the output of one of the NAND gates of a gate pair 512 is shown connected to the inputs of both NOR gates in a gate pair 514 via a conductor layer having an impedance 504, represented by a resistor in series with the connection, and a capacitor between the connection and ground. The other output of the NAND gate pair 512 is connected to the other inputs of both NOR gates in the gate pair 514 via a different conductive layer 506.

The outputs of the second gate pair 514 of the alternating gate stage 502 are connected in a similar fashion to that just described. However, the interconnections to the different conductive layers are shown staggered with respect to the alternating pairs 512 and 514. The signal path through the dual path ring oscillator 500 will now be discussed with reference to FIGS. 5 and 6.

Figure 6:
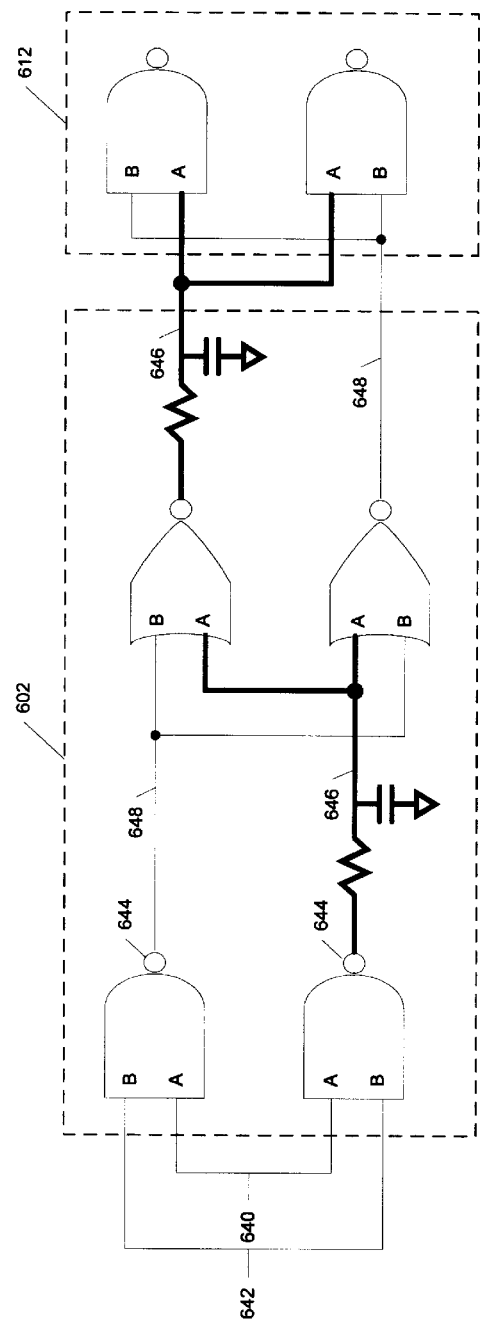
FIG. 6 is a schematic portion of the test ring oscillator of FIG. 5, particularly illustrating the path through the metal connection.

In FIG. 6, a portion of the ring oscillator 500 is shown. More specifically an alternating gate stage 602 is shown connected to a following NAND gate pair 612. The gate stage 602 and gate pair 612 illustrate interconnection of a NAND gate pair to a NOR gate pair, and back to a NAND gate pair, to better understand the propagation of a signal through the oscillator 500.

For each gate pair, whether NAND or NOR, each of the gates has two inputs designated as A inputs 640, and B inputs 642. And, for each gate pair there exists two outputs 644, one for each gate. The output of one of the gates in a first gate pair is connected via a metal conductive layer having an impedance 646, to the A inputs of both gates in the following stage. The output of the other gate in the first gate pair is connected directly, via 648, to the B inputs of both gates in the following stage. This connection strategy is followed throughout the oscillator 500 with the metal interconnection 646 used from the output of one of the gates in a preceding gate pair to the A inputs 640 of a following gate pair, and the direct connection 648 from the output of the other gate in the preceding pair to the B inputs 642 of the following gate pair. The metal connections 646 along path A are shown in bold to indicate one of the paths through the oscillator 500.

By interconnecting the A inputs of the alternating pairs with one conductive layer, and the B inputs with a different conductive layer, propagation through paths A and B can be combined into a single periodic signal. Signal flow through the oscillator 500 proceeds through path A for one of the signal edges, say a low to high transition, and through path B for the second signal edge, say a high to low transition.

One skilled in the art will appreciate that for a NAND gate, in any of the NAND gate stage pairs, a transition from low to high can occur when either the A or B input goes low. However, for a transition from high to low, both A and B inputs must be high. Thus, using the interconnection methodology shown in FIG. 7, a high to low transition can occur only when the input A (via the metal connection) and the input B (via the non metal connection) are both high. Since signal propagation from the prior stage takes longer through the metal connection, NAND gates in the gate pair cannot transition from high to low until propagation through the metal interconnection arrives at the A input. Thus, a low to high output transition in a NAND gate pair is typically caused by a transition in the B input (no metal connection), while a high to low output transition in a NAND gate pair is caused by a transition in the A input (metal connection).

In contrast, a NOR gate can transition from high to low based on a transition at either input, while a transition from low to high requires both the A and B inputs to be low. Thus, the NOR gates in the NOR gate stage pairs typically transition from high to low when the B input (no metal connection) transitions. However, an output transition from low to high requires that both the A and B inputs to be low, which means that the output transition will be held up until propagation to the A input (through the metal connection) arrives.

Thus, a high to low transition is held up in the NAND gate pairs awaiting propagation through the metal connection, while a low to high transition in the NOR gate pairs is held up awaiting propagation through the metal connection. Transitions in the opposite directions, respectively, are not held up, and thus are made via the non metal connection path.

Referring to FIG. 5, two connection nodes are provided at the top left portion of the oscillator 500. An Enable signal 520 is provided to turn the oscillator 500 on. When the Enable signal 520 is 0, the oscillator 500 is off. When the Enable signal 520 is 1, the oscillator 500 is on. The second connection node is the Ring signal 522. This signal 522 is fed back to the gate pair of the oscillator 500 from one of the outputs of the last stage. The signal 522 is used to measure the period and duty cycle of the periodic signal which flows through the oscillator 500.

Figure 4:
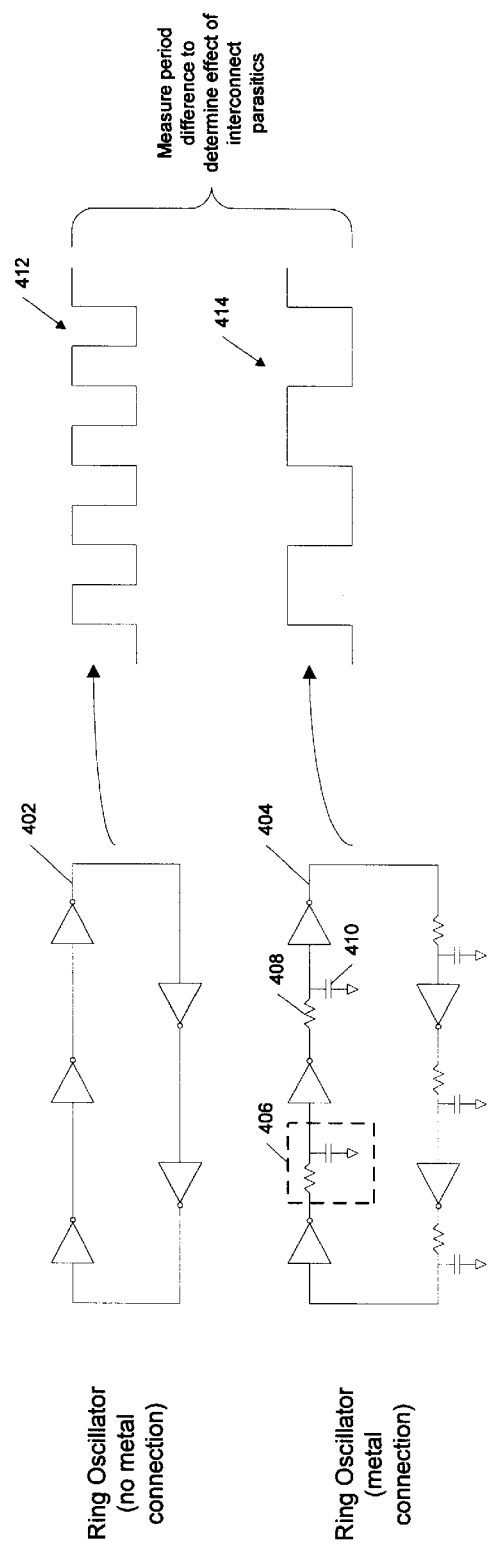
FIG. 4 shows two ring oscillators; the first having direct connection between inverter stages, and the second having metal connections between the inverter stages, along with associated timing diagrams.
Figure 7:
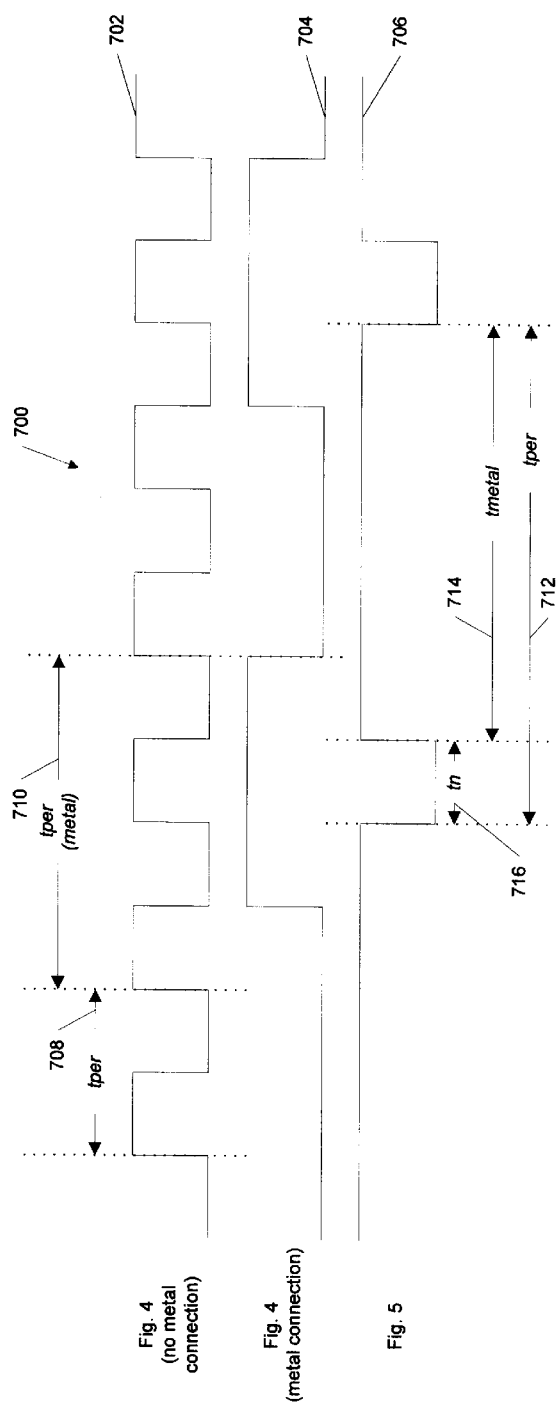
FIG. 7 is a timing diagram illustrating the waveforms produced by the circuits of FIGS. 3 and 5.

Now referring to FIG. 7, a timing diagram 700 is shown which illustrates the periodic signals produced by the two oscillators shown in FIG. 4, as well as the periodic signal produced by the oscillator 500 of the present invention. The periodic signal 702 of the oscillator in FIG. 4 having no metal connection has a period of tper 708. The periodic signal 704 of the oscillator in FIG. 4 having a metal connection has a period of tper (metal) 710. As discussed in the Background above, two measurements were made to determine that periods of the two signals 702, 704, and a comparison is performed to determined the parasitic effect of the metal interconnection. In this illustration, the metal interconnection created a 3× difference in the periods of the ring oscillators.

Now looking at periodic signal 706, a waveform is shown which has a total period of tper 712 that is similar in time to signal 704. However, the duty cycle of signal 706 is not 50% as would normally be expected in a ring oscillator. Rather, a duty cycle of approximately 83% is shown. The portion of the waveform 706 that has a logic level of 1 is shown as tmetal 714. The portion of the waveform 706 that has a logic level of 0 is shown as tn 716. Portion 714 relates to the propagation through the A path of the oscillator 500 of a low to high transition, for example. Portion 716 relates to the propagation through the B path of the oscillator 500 of a high to low transition.

Thus, in one embodiment of the present invention, one of the logic signal transitions within the dual path ring oscillator propagates through interconnections made via a first conductive layer or material, and the second logic signal transition propagates through interconnections made via a second conductive layer or material. The resulting oscillation is a periodic signal having a duty cycle that varies based on the parasitic differences in the two conductive paths.

Now referring to FIGS. 8 and 9, schematic diagrams 800,900 are provided for the NAND and NOR gates used in the dual path ring oscillator of the present invention. Each of the gates have A inputs 802,902; B inputs 804, 904; and Y outputs 806,906, respectively. However, one skilled in the art will appreciate that the NAND/NOR gates 800, 900 shown in FIGS. 8 and 9 are different than those typically used.

For example, in NAND gate 800, both of the $Q_{on}$ transistors, and the $Q_{off}$ transistor have been added to the NAND gate 800 to insure that signal transitions at the output Y 806 resulting from changes in either the A input 802 or the B input 804 are propagated through two transistors. Also, in NOR gate 900, both of the $Q_{on}$ transistors, and the $Q_{off}$ transistor have been added to the NOR gate to insure that signal transitions at the output Y 906 resulting from changes in either the A input 902 or the B input 904 are propagated through two transistors. By requiring the same transistor propagation through inputs A and B, the gates 800 and 900 help eliminate any circuit distinctions between the two paths used in the oscillator of the present invention.

Tables 810, 910 are provided to assist the reader in determining the operation of the gates.

Figure 1:
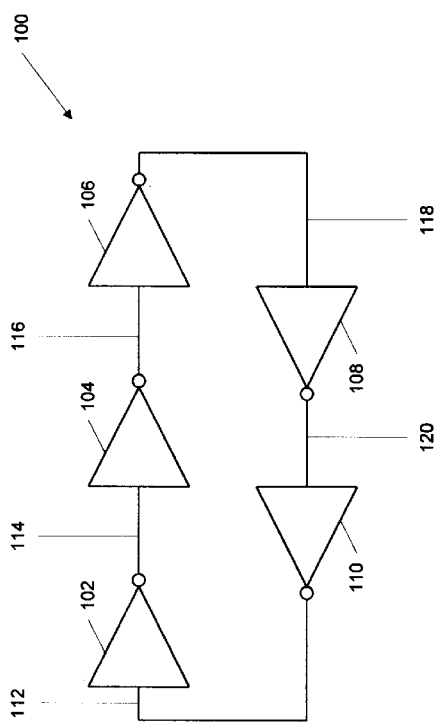
FIG. 1 is a schematic diagram of a prior art ring oscillator.
Figure 2:
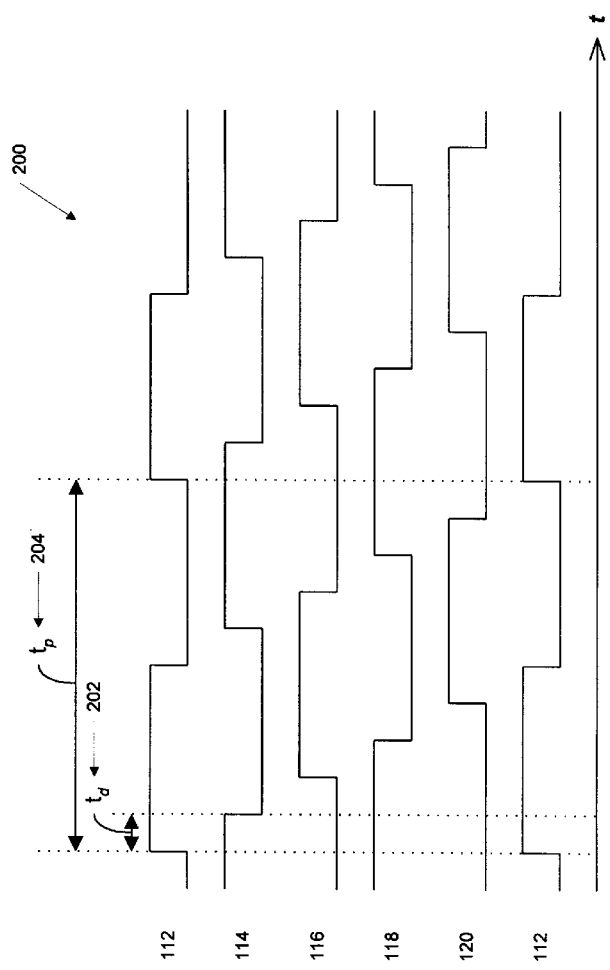
FIG. 2 is a timing diagram which illustrates the operation of the ring oscillator of FIG. 1.
Figure 3:
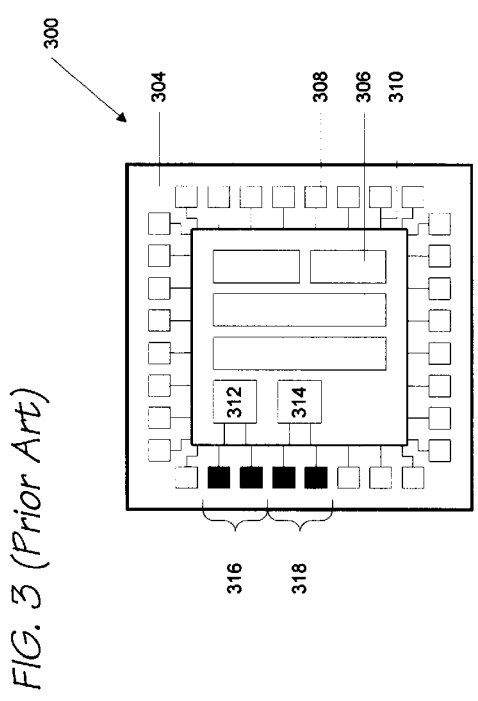
FIG. 3 is a prior art block diagram of a semiconductor chip which includes the two ring oscillators of FIG. 4.

Now referring to FIG. 10, a semiconductor 1000 is shown incorporating the present invention. The semiconductor 1000 contains a surface 1004 for connection to external devices. Circuitry 1006 on the semiconductor 1000 is connected to external devices via I/O pads 1008. Configured on the semiconductor 1000 is the dual path oscillator 1012 of the present invention. The oscillator 1012 is shown connected to I/O pads 1016. In one embodiment, the pads could be used for the enable signal 520 and the ring signal 522. By referring to FIGS. 3 and 10, it should be clear that the present invention provides a method and apparatus for testing interconnection parasitics which requires half the number of connections as compared to the prior art.

Although the present invention has been described in considerable detail with reference to certain preferred versions thereof, other versions are possible. For example, one path through the oscillator of the present invention was illustrated without any electrical parasitics. What should be appreciated is that the duty cycle of the periodic signal produced by the present invention provides an absolute parasitic difference between two dissimilar conduction paths. It is therefore presumed that the circuit illustrated in FIG. 5 would be duplicated for each parasitic comparison which is desired. In addition, the NAND/NOR gate structure of the present invention allows two paths from two conductive layers to be traversed and combined into a single periodic signal. Other logical combinations may be possible which vary the duty cycle of a periodic signal based on parasitic differences in conductive paths.

Although the present invention and its advantages have been described in detail, it should be understood that various changes, substitutions and alterations can be made herein without departing from the spirit and scope of the invention as defined by the appended claims.

I claim:

1. A test apparatus for quantifying parasitics on a microprocessor, the test apparatus comprising:

a plurality of first gate stages, said first gate stages having a first portion and a second portion;

a plurality of second gate stages, said second gate stages having a first portion and a second portion, said second gate stages connected in between said plurality of first gate stages, wherein said plurality of first gate stages and said plurality of second gate stages are connected together to form a ring oscillator, said ring oscillator producing a periodic signal;

a first signal path within said ring oscillator, said first signal path flowing through said first portion of said plurality of first gate stages and said first portion of said plurality of second gate stages;

a second signal path within said ring oscillator, said second signal path flowing through said second portion of said plurality of first gate stages and said second portion of said plurality of second gate stages;

a test node, connected between one of said plurality of first gate stages and one of said plurality of second gate stages, for monitoring said periodic signal produced by said ring oscillator;

wherein the high portion of said periodic signal produced by said ring oscillator at said test node flows through said first signal path, and the low portion of said periodic signal produced by said ring oscillator at said test node flows through said second signal path;

whereby the relationship of said high portion and said low portion of said periodic signal at said test node corresponds to the difference between said parasitics of said first signal path and said second signal path.

2. The test apparatus, as recited in claim 1, wherein said first gate stages comprise a pair of NAND gates.

3. The test apparatus, as recited in claim 2, wherein said first portion comprises a first input into both of said pair of NAND gates.

4. The test apparatus, as recited in claim 3, wherein said second portion comprises a second input into both of said pair of NAND gates.

5. The test apparatus, as recited in claim 1, wherein said second gate stages comprise a pair of NOR gates.

6. The test apparatus, as recited in claim 5, wherein said first portion comprises a first input into both of said pair of NOR gates.

7. The test apparatus, as recited in claim 6, wherein said second portion comprises a second input into both of said pair of NOR gates.

8. The test apparatus, as recited in claim 1, wherein said first gate stages and said second gate stages are alternately connected serially to form said ring oscillator.

9. The test apparatus, as recited in claim 1, wherein there are an odd cumulative number of said first and second gate stages in said ring oscillator.

10. The test apparatus, as recited in claim 1, wherein said periodic signal is a digital signal.

11. The test apparatus, as recited in claim 1, wherein when said interconnection parasitics are the same for said first signal path and said second signal path, said periodic signal has a duty cycle that is approximately 50%.

12. The test apparatus, as recited in claim 1, wherein when said interconnection parasitics are not the same for said first signal path and said second signal path, said periodic signal has a duty cycle that is not 50%.

13. The test apparatus, as recited in claim 12, wherein said duty cycle corresponds to the difference between said interconnection parasitics of said first signal path and said second signal path.

14. The test apparatus, as recited in claim 1, wherein the connection between said first portion of said first and second gate stages is made without metal.

15. The test apparatus, as recited in claim 1, wherein the connections between said first portions of said first and second gate stages are made using polysilicon, or a polysilicon silicide combination (polycide).

16. The test apparatus, as recited in claim 1, wherein the connections between said second portions of said first and said second gate stages are made using metal.

17. The test apparatus, as recited in claim 1, wherein the connections between said first portions and said second portions of said first and second gate stages are made with metals having different interconnection parasitics.

18. The test apparatus, as recited in claim 1 wherein said interconnection parasitics comprise electrical impedance characteristics of said connections between said first and said second gate stages.

19. The test apparatus, as recited in claim 18, wherein said impedance characteristics comprise the capacitance and resistance of said connections.

20. The test apparatus, as recited in claim 1, further comprising:
an enable signal, connected to either a first or second portion of one of said plurality of first gate stages, for enabling said ring oscillator to produce said periodic signal.

21. A semiconductor device, manufactured on a substrate, the semiconductor device having a plurality of transistors connected together with interconnection materials having dissimilar electrical parasitics, the semiconductor device having a plurality of test circuits, the test circuits providing indicia of the electrical parasitics of the interconnection materials, each of the test circuits comprising:
a dual path ring oscillator, said ring oscillator comprising:
a plurality of gate stages connected together to form a ring;
a first path through said gate stages connected using a first interconnection material; and
a second path through said gate stages connected using a second interconnection material;
wherein said first path and said second path through said gate stages produces a periodic signal, said signal having a duty cycle corresponding to the electrical parasitic difference between said first interconnection material and said second interconnection material; and
a test node, connected between two of said plurality of gate stages, for detecting said periodic signal.

22. The semiconductor device, as recited in claim 21, wherein said electrical parasitics of said interconnection materials comprise the resistance and capacitance of said materials.

23. The semiconductor device, as recited in claim 21, wherein said plurality of gate stages further comprises:
an alternating pair of logic gates, each of said alternating pair having a first portion and a second portion, said first portion connected to said first interconnection material, and said second portion connected to said second interconnection material.

24. The semiconductor device, as recited in claim 23, wherein said alternating pair further comprises:
a NAND gate structure; and
a NOR gate structure, connected to said NAND gate structure.

25. The semiconductor device, as recited in claim 24, wherein said NAND gate structure comprises a pair of NAND gates, and said NOR gate structure comprises a pair of NOR gates.

26. The semiconductor device, as recited in claim 24, wherein said first portion comprises a first set of inputs into both of said NAND gate structure and said NOR gate structure; and said second portion comprises a second set of inputs into both of said NAND gate structure and said NOR gate structure.

27. The semiconductor device, as recited in claim 26, wherein said first set of inputs provides said first path through said gate stages, and said second set of inputs provides said second path through said gate stages.

28. The semiconductor device, as recited in claim 21, wherein said first path provides propagation of said periodic signal through said ring oscillator when said periodic signal at said test node transitions from low to high.

29. The semiconductor device, as recited in claim 21, wherein said second path provides propagation of said periodic signal through said ring oscillator when said periodic signal at said test node transitions from high to low.

30. The semiconductor device, as recited in claim 21, wherein the high portion of said periodic signal at said test node propagates through said ring oscillator along said first path, and the low portion of said periodic signal at said test node propagates through said ring oscillator along said second path.

31. A method for measuring parasitics on a semiconductor device, the semiconductor device having a dual path test circuit which produces a periodic signal, the method comprising the steps of:
connecting a first interconnection material along a first path of the dual path test circuit;
connecting a second interconnection material along a second path of the dual path test circuit;
measuring the high portion of the periodic signal propagated through the first path;
measuring the low portion of the periodic signal propagated through the second path; and
comparing the measured high and low portions of the periodic signal to determine the parasitic difference between the first and second interconnection materials.

32. The method for measuring parasitics, as recited in claim 31, wherein the duty cycle of the periodic signal is approximately 50% when the first and second interconnection materials have approximately the same parasitics.

33. The method for measuring parasitics, as recited in claim 31, wherein the duty cycle of the periodic signal is not 50% when the first and second interconnection materials have different parasitics.

34. The method for measuring parasitics, as recited in claim 31, wherein parasitics comprise the capacitance and resistance of an interconnection material.

35. The method for measuring parasitics, as recited in claim 31, further comprising the step of:

provided a test pad on the semiconductor device, the test pad being connected to the dual path test circuit, the test pad providing a connection point for measuring the periodic signal.

36. The method for measuring parasitics, as recited in claim 31, wherein the dual path test circuit comprises a ring oscillator.

37. The method for measuring parasitics, as recited in claim 36, wherein the ring oscillator comprises a plurality of logic gates connected in series, with the output of the last logic gate connected to the input of the first logic gate, to form a ring.

38. The method for measuring parasitics, as recited in claim 36, wherein the first and second interconnection material connect the plurality of logic gates to each other.

39. The method for measuring parasitics, as recited in claim 31, wherein the period of the periodic signal corresponds to the cumulative propagation time through the first and second path.

* * * * *